United States Patent
Nishizawa et al.

(10) Patent No.: US 9,412,944 B2
(45) Date of Patent: Aug. 9, 2016

(54) ORGANIC MOLECULAR MEMORY

(71) Applicant: Kabushiki Kaisha Toshiba, Minato-ku (JP)

(72) Inventors: Hideyuki Nishizawa, Toshima (JP); Yusuke Tanaka, Kawasaki (JP); Koji Asakawa, Kawasaki (JP); Yutaka Majima, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/843,229

(22) Filed: Sep. 2, 2015

(65) Prior Publication Data
US 2016/0087203 A1   Mar. 24, 2016

(30) Foreign Application Priority Data
Sep. 22, 2014 (JP) .................... 2014-193009

(51) Int. Cl.
 *H01L 51/05* (2006.01)
 *H01L 51/10* (2006.01)
 *H01L 45/00* (2006.01)
 *G11C 13/00* (2006.01)
 *H01L 51/00* (2006.01)
(52) U.S. Cl.
 CPC .......... *H01L 45/142* (2013.01); *G11C 13/0014* (2013.01); *G11C 13/0016* (2013.01); *H01L 45/1253* (2013.01); *H01L 51/0092* (2013.01); *H01L 51/0098* (2013.01); *H01L 51/0591* (2013.01); *H01L 51/0595* (2013.01)
(58) Field of Classification Search
 None
 See application file for complete search history.

(56) References Cited

U.S. PATENT DOCUMENTS

| 9,047,941 | B2 | 6/2015 | Nishizawa et al. |
| 9,054,324 | B2 | 6/2015 | Nishizawa et al. |
| 9,263,687 | B2* | 2/2016 | Tanaka ................ H01L 51/0595 |
| 2004/0191567 | A1 | 9/2004 | Caballero |
| 2012/0241713 | A1 | 9/2012 | Nishizawa et al. |
| 2014/0008601 | A1 | 1/2014 | Nishizawa et al. |
| 2015/0228335 | A1 | 8/2015 | Nishizawa et al. |
| 2015/0236171 | A1 | 8/2015 | Nishizawa et al. |

FOREIGN PATENT DOCUMENTS

| JP | 2008-066542 | 3/2008 |
| JP | 2012-204433 | 10/2012 |
| JP | 2012-204434 | 10/2012 |

OTHER PUBLICATIONS

Yutaka Majima, et al., "Negative Differential Resistance by Molecular Resonant Tunneling between Neutral Tribenzosubporphine Anchored to a Au(111) Surface and Tribenzosubporphine Cation Adsorbed on to a Tungsten Tip", The Journal of the American Chemical Society, 2013, (135), 8 pgs.

* cited by examiner

*Primary Examiner* — Minh-Loan Tran
(74) *Attorney, Agent, or Firm* — Oblon, McClelland, Maier & Neustadt, L.L.P.

(57) ABSTRACT

An organic molecular memory in an embodiment includes a first electrode having a first work function; a second electrode having a second work function; and an organic molecular layer provided between the first electrode and the second electrode, the organic molecular layer containing a first organic molecule chemically bonded to the first electrode, the first organic molecule having a resistance-change type molecular chain, and the first organic molecule having a first energy level higher than the first work function, and a second organic molecule chemically bonded to the second electrode and the second organic molecule having a second energy level higher than the second work function and lower than the first energy level.

14 Claims, 16 Drawing Sheets

US 9,412,944 B2

ORGANIC MOLECULAR MEMORY

CROSS-REFERENCE TO RELATED APPLICATION

This application is based upon and claims the benefit of priority from Japanese Patent Application No. 2014-193009, filed on Sep. 22, 2014, the entire contents of which are incorporated herein by reference.

FIELD

Embodiments described herein relate generally to organic molecular memories.

BACKGROUND

Using organic molecules in a memory cell reduces the size of the memory cell because the size of the organic molecules themselves is small. Consequently, the memory density can be increased. Therefore, it has been attempted to interpose, between upper and lower electrodes, molecules having the capability of being changed in resistance by the presence or absence of an electric field or the injection of charges, and thereby to make a memory cell. The molecules changes the resistance by a voltage applied across the upper and lower electrodes. By utilizing the change of resistance, the memory cell stores a data. And, by detecting a difference in flowing currents, a data stored in the memory cell can be read. It is important in an organic molecular memory to reduce characteristics variations between a plurality of memory cells in realizing an organic molecular memory with high operational stability.

DETAILED DESCRIPTION

Figure 1:
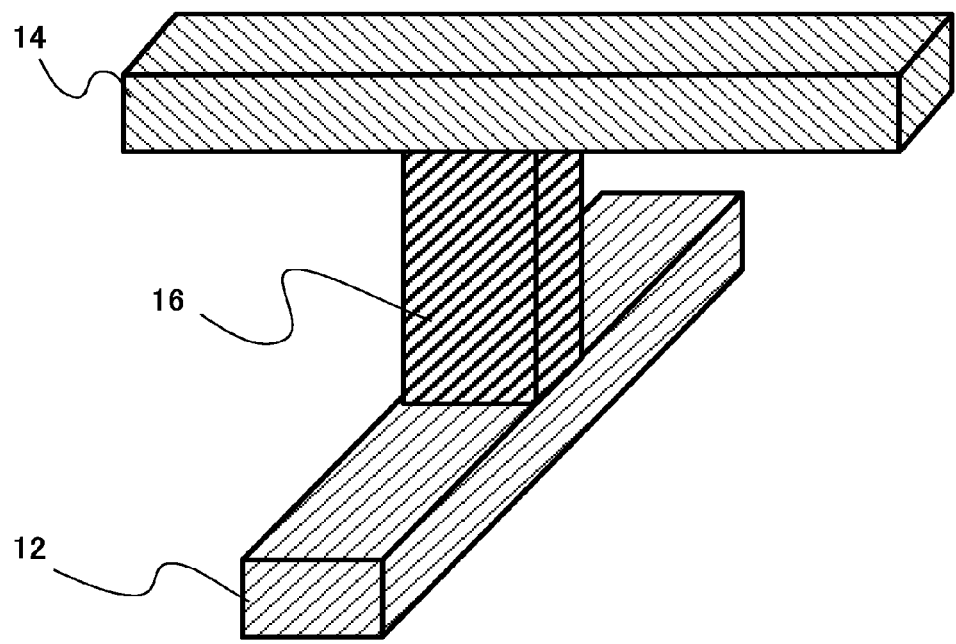
FIG. 1 is a schematic perspective view of an organic molecular memory in an embodiment.

An organic molecular memory in an embodiment includes a first electrode having a first work function; a second electrode having a second work function; and an organic molecular layer provided between the first electrode and the second electrode, the organic molecular layer containing a first organic molecule chemically bonded to the first electrode, the first organic molecule having a resistance-change type molecular chain, and the first organic molecule having a first energy level higher than the first work function, and a second organic molecule chemically bonded to the second electrode and the second organic molecule having a second energy level higher than the second work function and lower than the first energy level.

In the description, the same or similar members are denoted by the same reference numerals, and redundant descriptions of them will not be made.

In the description, the words "upper" and "lower" are used to express a relative positional relationship between components or the like. In the description, the concept of the words "upper" and "lower" does not necessarily refer to a relationship with respect to the direction of gravity.

In the description, the word "resistance-change type molecular chain" means a molecular chain having the capability of being changed in resistance by the presence or absence of an electric field or the injection of charges.

In the description, the word "chemical bond" is a concept referring to one of a covalent bond, an ionic bond, and a metallic bond, and is a concept excluding a hydrogen bond and a bond by a Van der Waals force.

Hereinafter, an embodiment will be described with reference to the drawings.

An organic molecular memory in this embodiment includes a first electrode having a first work function, a second electrode having a second work function, and an organic molecular layer provided between the first electrode and the second electrode and containing a first organic molecule chemically bonded to the first electrode, having a resistance-change type molecular chain, and having a first energy level higher than the first work function, and a second organic molecule chemically bonded to the second electrode and having a second energy level higher than the second work function and lower than the first energy level.

In the organic molecular memory in this embodiment, the difference in energy that needs to be equated between the first organic molecule and the second electrode to pass current through the organic molecular layer is substantially the energy difference between the first organic molecule and the second organic molecule. Consequently, the energy difference between the first organic molecule and the second electrode side is prevented from being affected by the surface state of the second electrode. Consequently, current flowing through the organic molecular layer is stabilized. Therefore, an organic molecular memory with high operational stability is realized.

FIG. 1 is a schematic perspective view of an organic molecular memory in this embodiment.

The organic molecular memory in this embodiment is a resistance-change type organic molecular memory of a cross-point type. As shown in FIG. 1, a lower electrode wire (first electrode) 12 provided on a top portion of a substrate (not shown), for example, is provided. An upper electrode wire (second electrode) 14 is provided to cross the lower electrode wire 12. A design rule of electrode wiring is, for example, 5 nm or more to 20 nm or less.

As shown in FIG. 1, an organic molecular layer 16 is provided between the lower electrode wire 12 and the upper electrode wire 14 at an intersection of the lower electrode wire 12 and the upper electrode wire 14. The thickness of the organic molecular layer 16 is, for example, 1 nm or more to 20 nm or less. In terms of scaling-down of a memory cell, it is desirably 1 nm or more to 5 nm or less.

The organic molecular layer 16 is provided at each of the intersections of lower electrode wires 12 and upper electrode wires 14 as shown in FIG. 1, for example, to form memory cells. Thus, a memory cell array including a plurality of memory cells is realized.

Figure 2A:
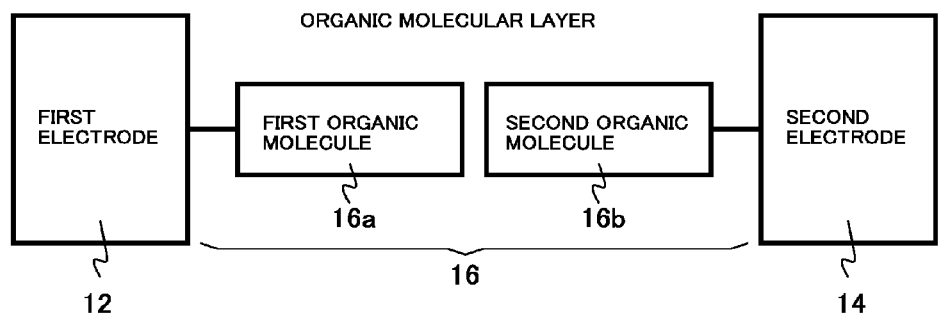
FIGS. 2A and 2B are diagrams illustrating a structure of the organic molecular memory in the embodiment.
Figure 2B:
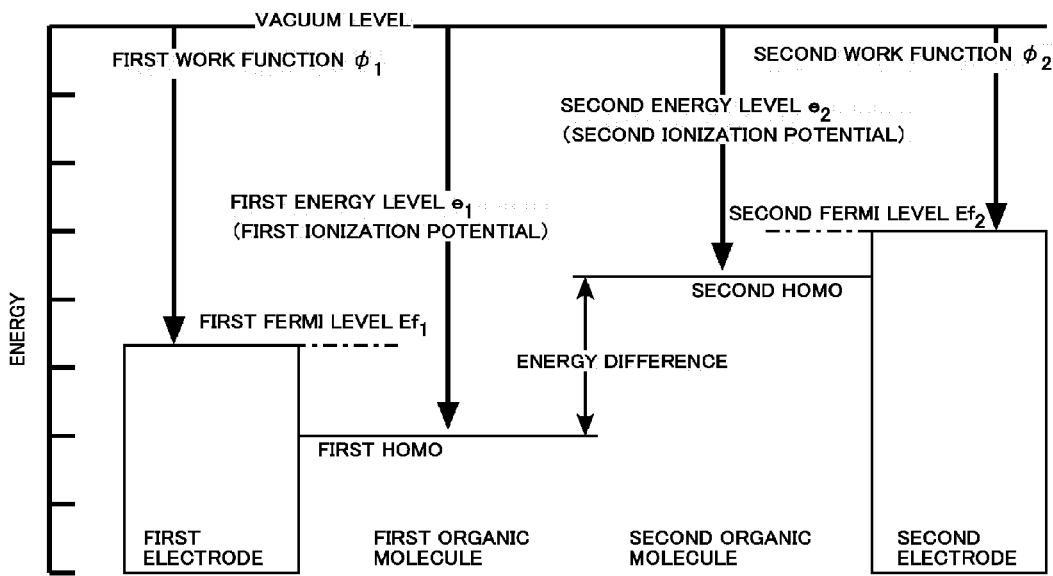

FIGS. 2A and 2B are diagrams illustrating a structure of the organic molecular memory in this embodiment. FIG. 2A is a schematic conceptual diagram of the memory cell, and FIG. 2B is a diagram illustrating the relationships between energy levels in the memory cell.

The organic molecular layer 16 in this embodiment includes a first organic molecule 16a chemically bonded to the first electrode 12, and a second organic molecule 16b chemically bonded to the second electrode 14. The first organic molecule 16a has a resistance-change type molecular chain chemically bonded to the first electrode 12. The first organic molecule 16a and the second organic molecule 16b are not chemically bonded.

The first electrode 12 has a first work function $\phi_1$, and the second electrode 14 has a second work function $\phi_2$. The work function is an energy difference between the vacuum level and the Fermi level.

The first organic molecule 16a has a first energy level $e_1$, and the second organic molecule 16b has a second energy level $e_2$. Here, when holes are held in a resistance-change type molecular chain, for example, the energy level of the organic molecule is an energy difference between the vacuum level and the highest occupied molecular orbital (HOMO) level. When the energy level of an organic molecule is a difference between the vacuum level and the HOMO level, it is referred to as an ionization potential. When electrons are held in a resistance-change type molecular chain, for example, the energy level of the organic molecule is an energy difference between the vacuum level and the lowest unoccupied molecular orbital (LUMO) level. When the energy level of an organic molecule is an energy difference between the vacuum level and the LUMO level, it is also referred to as an electron withdrawing force. FIG. 2B illustrates the case of HOMO level as an example.

In this embodiment, the first organic molecule 16a and the second organic molecule 16b are not chemically bonded, so that different organic molecules can have independent energy levels.

The first energy level $e_1$ is higher than the first work function $\phi_1$. The second energy level $e_2$ is higher than the second work function $\phi_2$, and lower than the first energy level $e_1$.

Figure 3:
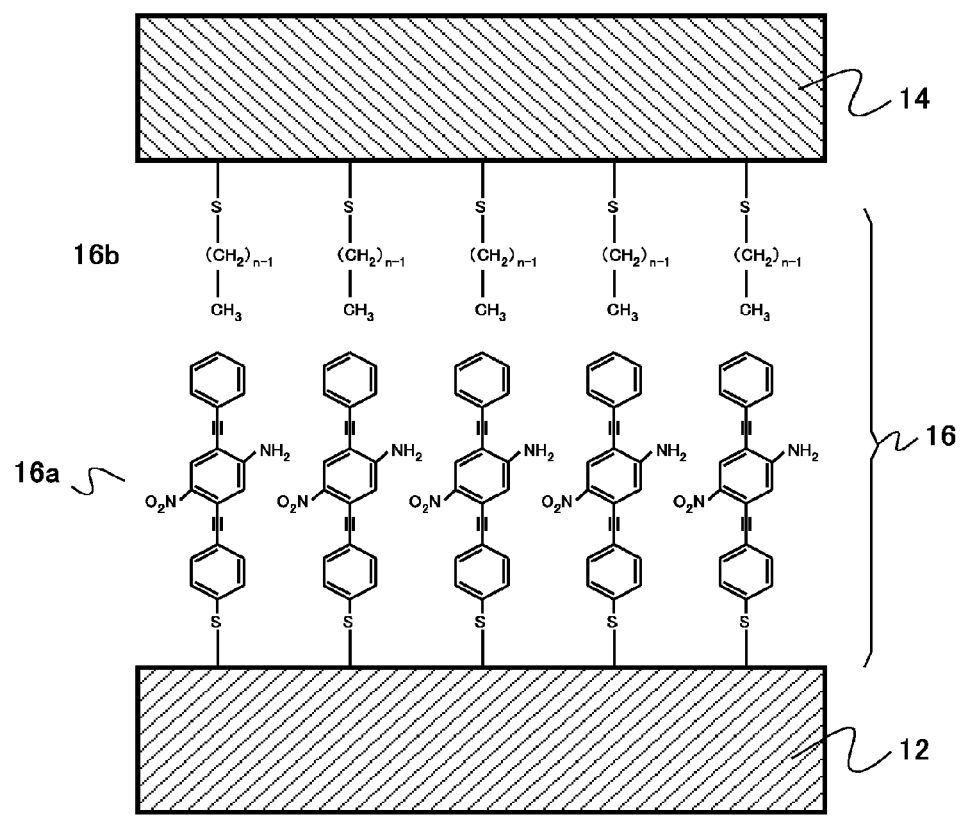
FIG. 3 is a schematic cross-sectional view of a memory cell portion of the organic molecular memory in the embodiment.

FIG. 3 is a schematic cross-sectional view of a memory cell portion of an organic molecular memory in this embodiment. As shown in FIG. 3, the organic molecular layer 16 in this embodiment contains a plurality of first organic molecules 16a and a plurality of second organic molecules 16b. The first organic molecules 16a and the second organic molecules 16b are an example of organic molecules in this embodiment.

One ends of the first organic molecules 16a are chemically bonded to the lower electrode wire 12. The first organic molecules 16a extend from the lower electrode wire 12 toward the upper electrode wire 14.

One ends of the second organic molecules 16b are chemically bonded to the upper electrode wire 14. The second organic molecules 16b extend from the upper electrode wire 14 toward the lower electrode wire 12.

The lower electrode wire 12 is formed on a silicon (Si) substrate (not shown), for example. The lower electrode wire 12 is tungsten (W), a metallic material, for example. The upper electrode wire 14 is molybdenum (Mo), a metallic material, for example.

Figure 4:
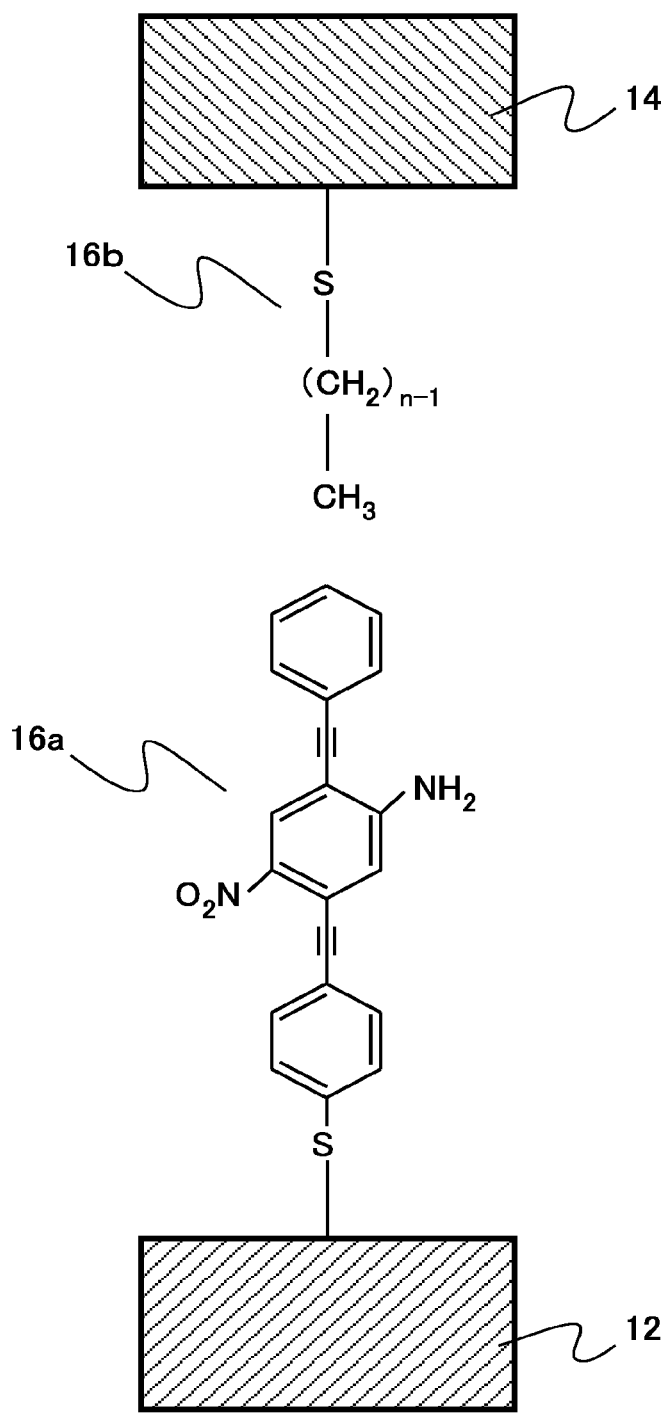
FIG. 4 is a diagram illustrating an example of molecular structures of organic molecules in the memory cell portion in the embodiment.

FIG. 4 is a diagram illustrating an example of molecular structures of organic molecules in a memory cell portion in this embodiment. The first organic molecules 16a and the second organic molecules 16b constituting the organic molecular layer 16 in this embodiment have molecular structures as shown in FIG. 4, for example.

The first organic molecule 16a has 4-[2-nitro-5-amino-4-(phenylethynyl)phenylethynyl]benzenethiol as a resistance-change type molecular chain. The resistance-change type molecular chain shown in FIG. 4 is also referred to as a tour wire.

The first organic molecule 16a has a thioether group (—S—) as a linker at one end. A sulfur atom (S) is chemically bonded to a surface of the lower electrode wire 12. Here, a linker means a chemically modifying group having a function of fixing a molecule to an electrode (conductive layer) by chemical bonding. The first organic molecules 16a form a so-called self-assembled monolayer (SAM).

The second organic molecule 16b has an alkyl chain (—$(CH_2)_{n-1}$—$(CH_3)$) in which n is from 3 to 11, and a thioether group (—S—) as a linker at one end. A sulfur atom (S) is chemically bonded to a surface of the upper electrode wire 14. The second organic molecules 16b form a so-called self-assembled monolayer (SAM). The linker of the first organic molecule 16a and the linker of the second organic molecule 16b may be the same or different. In terms of selectively bonding different organic molecules to electrodes on different sides, the linker of the first organic molecule 16a and the linker of the second organic molecule 16b *are desirably different*.

Next, functions and effects of this embodiment will be described.

Figure 5A:
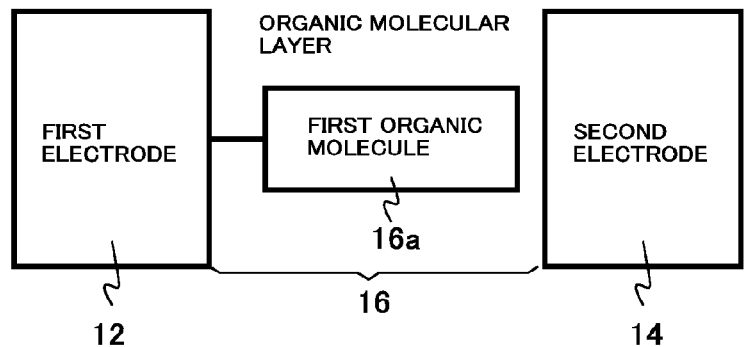
FIGS. 5A and 5B are diagrams illustrating a structure of an organic molecular memory in a comparative embodiment.
Figure 5B:
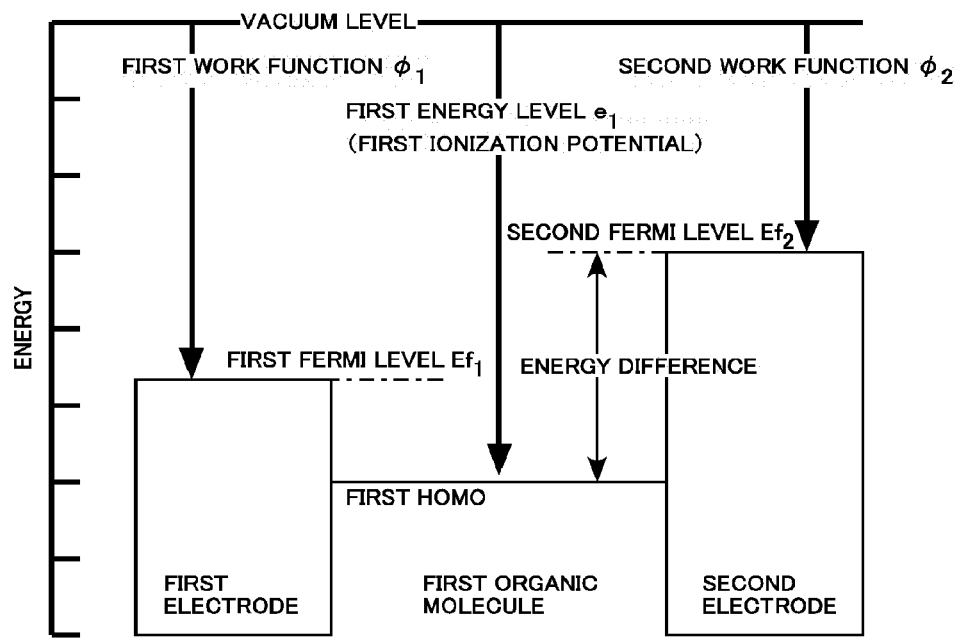

FIGS. 5A and 5B are diagrams illustrating a structure of an organic molecular memory in a comparative embodiment. FIG. 5A is a schematic conceptual diagram of a memory cell, and FIG. 5B is a diagram illustrating the relationships between energy levels in the memory cell.

Figure 6:
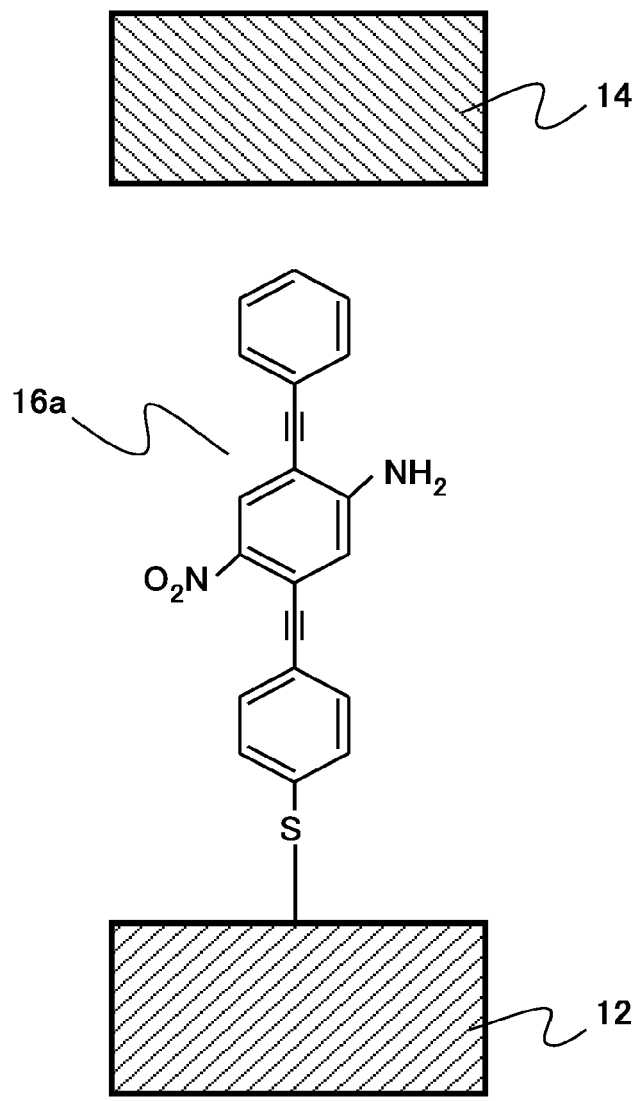
FIG. 6 is a diagram illustrating an example of a molecular structure of an organic molecule in a memory cell portion in the comparative embodiment.
Figure 7A:
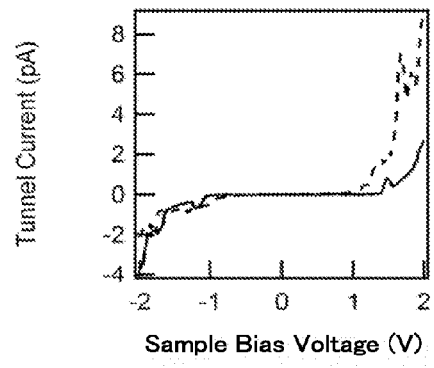
FIGS. 7A, 7B, 7C, 7D, and 7E are graphs showing current-voltage characteristics of memory cells of the organic molecular memory in the comparative embodiment.
Figure 7D:
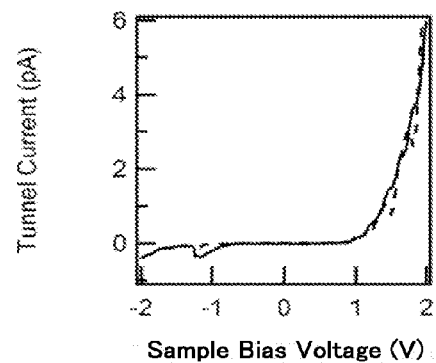
Figure 7B:
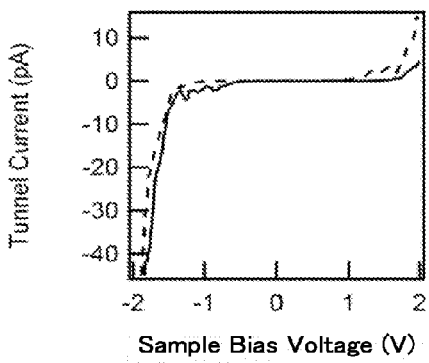
Figure 7E:
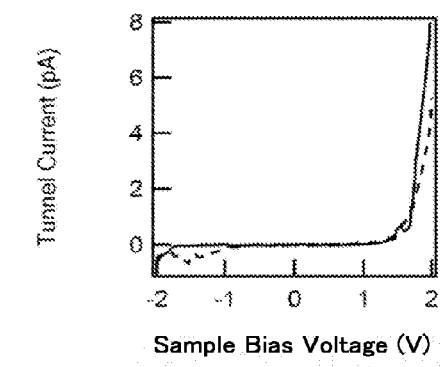
Figure 7C:
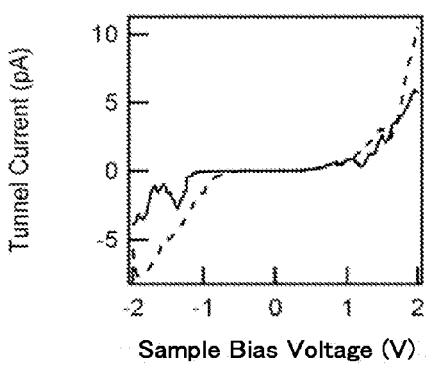

An organic molecular layer 16 in the comparative embodiment is different from that in the embodiment in that it does not include the second organic molecules 16b in the embodiment. FIG. 6 is a diagram illustrating an example of a molecular structure of an organic molecule in a memory cell portion in the comparative embodiment. First organic molecules 16a constituting the organic molecular layer 16 in the comparative embodiment have a molecular structure as shown in FIG. 6, for example.

FIGS. 7A, 7B, 7C, 7D, and 7E are graphs showing current-voltage characteristics of a memory cell of an organic molecular memory in the comparative embodiment. They show current-voltage characteristics of different organic molecules manufactured in the same manufacturing method.

The current-voltage characteristics show a similar tendency such as that of current rises in a region where the absolute value of voltage is 1[V] or more. However, for example, current at 2[V] is greatly different between them, and is inconsistent. Further, variations with time are seen in measurements of the same organic molecule.

The cause of the above-described variations in initial characteristics of the different organic molecules and variations with time of the same organic molecule is considered to lie in the surface state of the second electrode 14. Specifically, the cause is considered to lie in a change in the Fermi level due to surface oxidation of the second electrode 14, or a change in the Fermi level due to polycrystallization in the second electrode 14 during the production of the second electrode 14. The same crystal has different Fermi levels, depending on the orientation.

When current is passed through the organic molecular layer 16, a voltage is applied across the first electrode 12 and the second electrode 14 to shift the Fermi levels of the electrodes. For example, the first HOMO (first energy level ed of the first organic molecule 16a is brought into agreement with the second Fermi level ($Ef_2$) of the second electrode 14 in FIG. 5B, so that charges can be exchanged between the first organic molecule 16a and the second electrode 14, and current starts to flow.

Therefore, when the Fermi level of the second electrode 14 varies, the rise of current across the first organic molecule 16a and the second electrode 14 varies, resulting in variations in the current-voltage characteristics. Consequently, the operating current of the memory cell varies.

In this embodiment, the second organic molecules 16b chemically bonded to the second electrode 14 are provided between the first organic molecules 16a and the second electrode 14. Consequently, the energy difference between the first organic molecules 16a and the second electrode 14 when current is passed through the organic molecular layer 16 is effectively the energy difference between the first organic molecules 16a and the second organic molecules 16b.

The second energy level $e_2$ of the second organic molecules 16b is not affected by the surface state of the second electrode 14, for example. Further, unlike the Fermi level in the surface of the second electrode 14, the second energy level $e_2$ of the second organic molecules 16b has no variation factors.

Consequently, the energy difference between the first organic molecules 16a and the second electrode 14 side is stabilized. Thus, current flowing through the organic molecular layer 16 and the operating current of the memory cell are stabilized.

Further, in this embodiment, the second organic molecules 16b also function as an electrical resistance, increasing the resistance of the organic molecular layer 16. Consequently, leak current of the memory cell is reduced, and the signal/noise (S/N) ratio of the operating current of the memory cell is increased.

In terms of reducing a barrier between the second organic molecules 16b and the second electrode 14, the second energy level $e_2$ is desirably higher than the second work function $\phi_2$. In terms of reducing a barrier between the first organic molecules 16a and the second organic molecules 16b, the second energy level $e_2$ is desirably lower than the first energy level $e_1$. In terms of preventing the memory cell from being normally on, the first energy level $e_1$ is desirably higher than the first work function $\phi_1$.

It is desirable that a second blocking coefficient $p_2$ expressed by expression (2) wherein $\phi_2$ is a second work function, $e_2$ is a second energy level, and $L_2$ is the length of a second organic molecule, is lower than a first blocking coefficient $p_1$ expressed by expression (1) wherein $\phi_1$ is a first work function, $e_1$ is a first energy level, and $L_1$ is the length of a first organic molecule. $L_1$ and $L_2$ are lengths including linkers. In other words, the first blocking coefficient $p_1$ is higher than a second blocking coefficient $p_2$.

$$p_1 = (\phi_1 - e_1)^{1/2} \times L_1 \qquad (1)$$

$$p_2 = (\phi_2 - e_2)^{1/2} \times L_2 \qquad (2)$$

By the second blocking coefficient $p_2$ being lower than the first blocking coefficient $p_1$, the electrical resistance of the first organic molecules 16a becomes greater than the electrical resistance of the second organic molecules 16b. Consequently, the value of current flowing through the memory cell is mainly controlled by the first organic molecules 16a having the resistance-change type molecular chains. Consequently, the data detection accuracy of the memory cell is increased.

Further, according to this embodiment, the second organic molecules 16b also function as a surface protective layer of the second electrode 14, reducing a change in the state of the surface of the second electrode 14 due to oxidation or the like. Consequently, for example, a change in the resistance of the second electrode 14 itself, or in the resistance between the second organic molecules 16b and the second electrode 14 due to the surface oxidation of the second electrode 14 or the like is reduced.

The second organic molecules 16b desirably contain an alkyl chain with a carbon number of three or more to eleven or less. Exceeding the above range can cause too great an electrical resistance of the second organic molecules 16b, causing too small an operating current of the memory cell. Falling below the above range can deteriorate the function as a surface protective layer of the second electrode 14. Further, it can cause too large a leak current. The second organic molecules 16b more desirably contain an alkyl chain with a carbon number of five or more to eight or less.

In terms of having the resistance change characteristics, the first organic molecules 16a desirably contain a one-dimensional or pseudo-one-dimensional π-conjugated system chain to which an electron withdrawing group or an electron donating group is bonded in a direction other than a straight chain axis direction. The π-conjugated system chain contains either of a carbon compound selected from a group consisting of an acetylene skeleton, a diethylene skeleton, and a phenylene ring, or a heterocyclic compound selected from a thiophene ring, a pyrrole ring, and a furan ring. The carbon number of the π-conjugated system chain is desirably six or more to forty or less.

The electron withdrawing group bonded to the π-conjugated system chain is, for example, a nitro group ($-NO_2$), halogen ($-F$, $-Cl$, $-Br$, $-I$), a cyano group ($-C\equiv N$), a carbonyl group ($-C(=O)-$), a sulfonyl group ($-S(=O)_2-$), or a trialkylamino group ($-N^-R_3$).

The electron donating group bonded to the π-conjugated system chain is, for example, an alkoxy group ($-OR$), a hydroxyl group ($-OH$), an amino group ($-NH_2$), an alkylamino group ($-NHR$), a dialkylamino group ($-NR_2$), or an amide group ($-NHCOR$).

In terms of having rectification, the first organic molecule 16a is desirably described by molecular formula (1). Having rectification, resistance-change type molecular chains can also have a diode function required for each memory cell to realize a cross-point type memory cell. Thus, further scaling-down of a memory cell can be achieved.

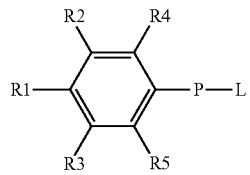
(1)

wherein, P is a one-dimensional or a pseudo-one-dimensional π-conjugated system chain, the π-conjugated system chain having an electron withdrawing group or an electron donating group bonded in a direction other than a straight chain axis direction, R1 is an amino group (—NH₂) or a nitro group (—NO₂), R2 to R4 are hydrogen atoms or methyl groups (—CH₃), and L is a chemically modifying group chemically bonding a first organic molecule to a first electrode.

In terms of having rectification, the first organic molecule 16a is desirably described by molecular formula (2):

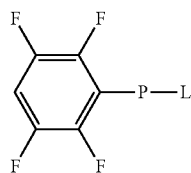
(2)

wherein P is a one-dimensional or pseudo-one-dimensional π-conjugated system chain, the π-conjugated system chain having an electron withdrawing group or an electron donating group bonded in a direction other than a straight chain axis direction, the π-conjugated system chain having an electron withdrawing group or an electron donating group bonded in a direction other than a straight chain axis direction. The one-dimensional or pseudo-one-dimensional π-conjugated system chain may be an oligophenylene ethynylene skeleton or an oligophenylenevinylene skeleton. L is a chemically modifying group chemically bonding a first organic molecule to a first electrode.

In terms of having rectification, the first organic molecule 16a is desirably described by molecular formula (3):

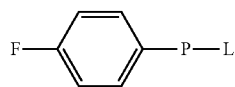
(3)

wherein P is a one-dimensional or pseudo-one-dimensional π-conjugated system chain, the π-conjugated system chain having an electron withdrawing group or an electron donating group bonded in a direction other than a straight chain axis direction. The one-dimensional or pseudo-one-dimensional π-conjugated system chain may be an oligophenyleneethynylene skeleton or an oligophenylenevinylene skeleton. L is a chemically modifying group chemically bonding a first organic molecule to a first electrode.

Further, L in molecular formulae (1), (2), and (3) is desirably a chemically modifying group selected from a group consisting of a thioether group (—S—), a dialkylsilylether group (—SiR₂O—), an ether group (—O—), a phosphonate ester group (—PO₃—), an ester group (—COO—), and an azo group (—N₂—), in terms of stably chemically bonding the first organic molecule 16a to the first electrode 12.

The first electrode 12 or the second electrode 14 desirably contains a metal selected from a group consisting of gold (Au), silver (Ag), copper (Cu), platinum (Pt), palladium (Pd), iron (Fe), tungsten (W), tungsten nitride (WN₂), tantalum (Ta), tantalum nitride (TaN), molybdenum (Mo), molybdenum nitride (MoN), and titanium nitride (TiN).

In terms of facilitating the manufacturing of the organic molecular memory, the first electrode 12 and the second electrode 14 desirably contain different metals.

As above, according to this embodiment, the current-voltage characteristics are less likely to be affected by the surface state of the second electrode 14. Consequently, current flowing through an organic molecular layer, that is, the operating current of a memory cell is stabilized. Thus, an organic molecular memory with high operational stability can be realized.

EXAMPLES

Hereinafter, examples will be described. FIGS. 8A, 8B, and 8C to FIGS. 16A, 16B, and 16C are diagrams showing the structures and evaluation results of organic molecules used in Examples 1 to 9 and Comparative Examples 1 to 9. FIGS. 8A to 16A show the molecular structures of the organic molecules, FIGS. 8B to 16B show current-voltage characteristics in the comparative examples, and FIGS. 8C to 16C show current-voltage characteristics in the examples.

Example 1

Figure 8A:
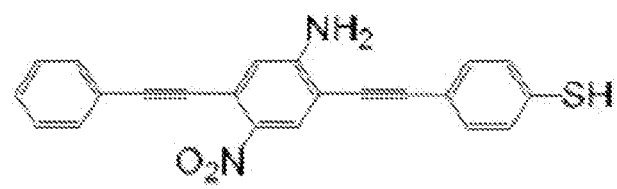
FIGS. 8A, 8B, and 8C are diagrams illustrating a structure and evaluation results of an organic molecule used in Example 1 and Comparative Example 1.
Figure 8B:
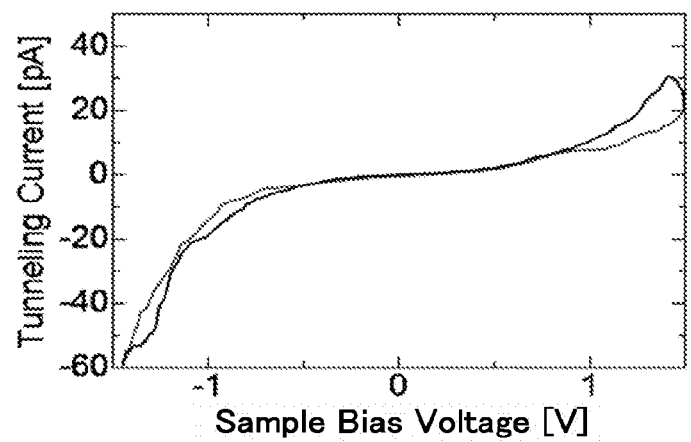
Figure 8C:
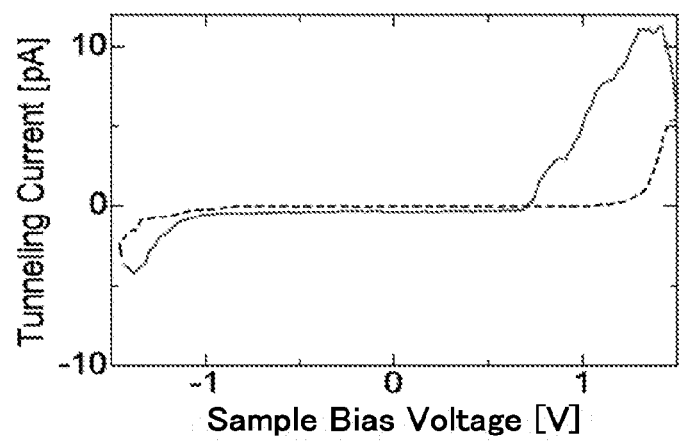
Figure 9A:
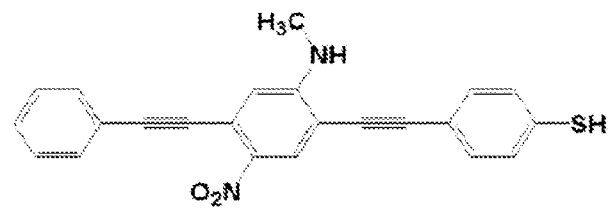
FIGS. 9A, 9B, and 9C are diagrams illustrating a structure and evaluation results of an organic molecule used in Example 2 and Comparative Example 2.
Figure 9B:
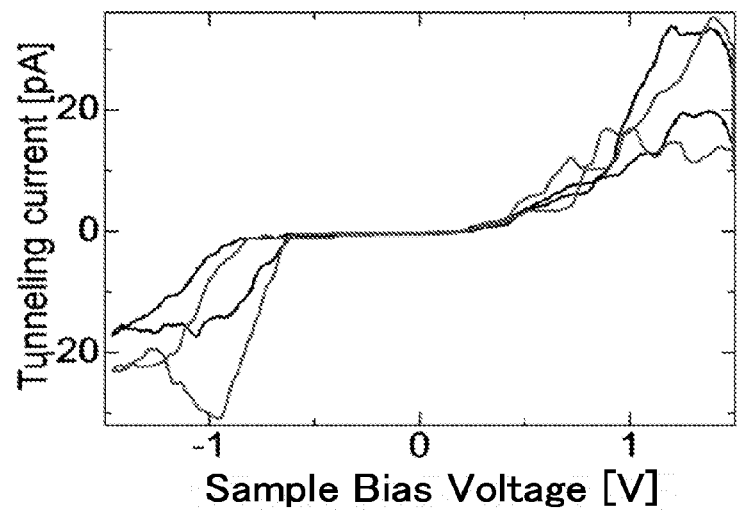
Figure 9C:
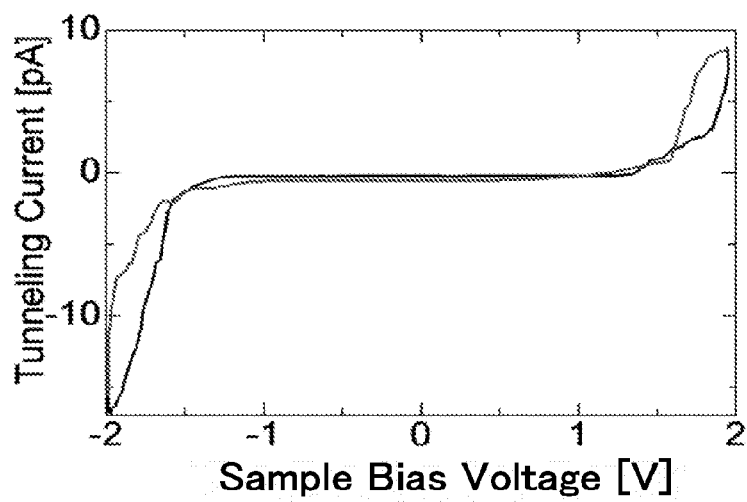
Figure 10A:
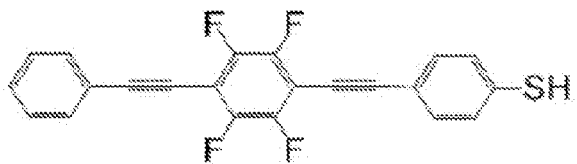
FIGS. 10A, 10B, and 10C are diagrams illustrating a structure and evaluation results of an organic molecule used in Example 3 and Comparative Example 3.
Figure 10B:
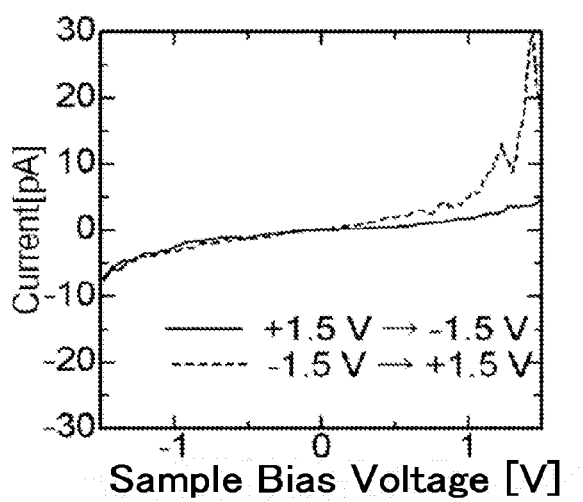
Figure 10C:
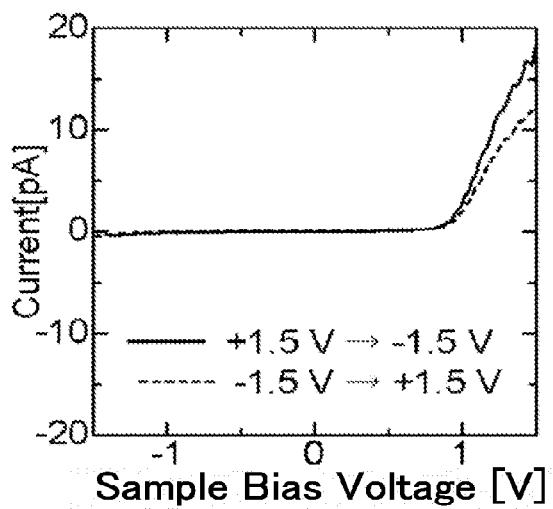
Figure 11A:
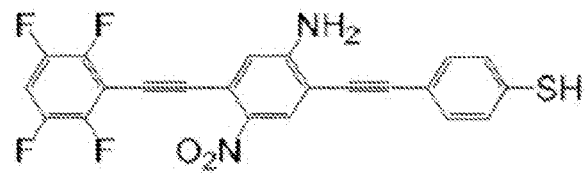
FIGS. 11A, 11B, and 11C are diagrams illustrating a structure and evaluation results of an organic molecule used in Example 4 and Comparative Example 4.
Figure 11B:
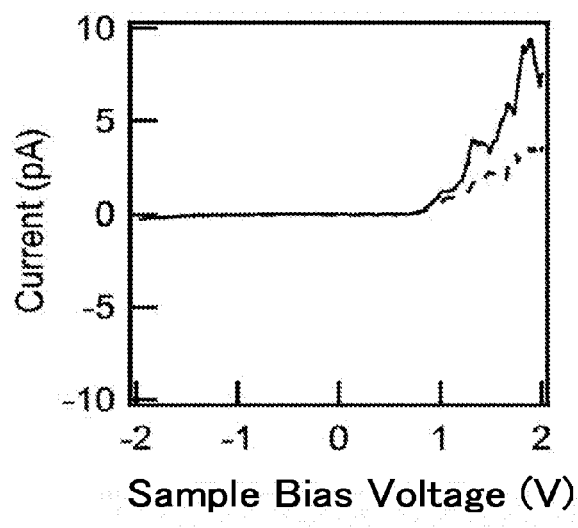
Figure 11C:
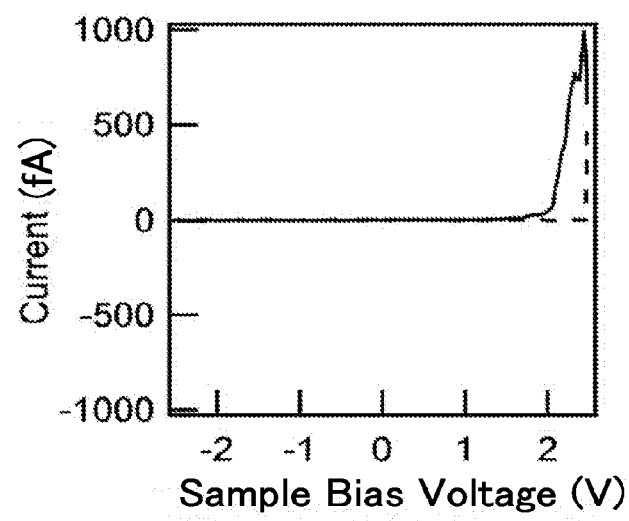
Figure 12A:
FIGS. 12A, 12B, and 12C are diagrams illustrating a structure and evaluation results of an organic molecule used in Example 5 and Comparative Example 5.
Figure 12B:
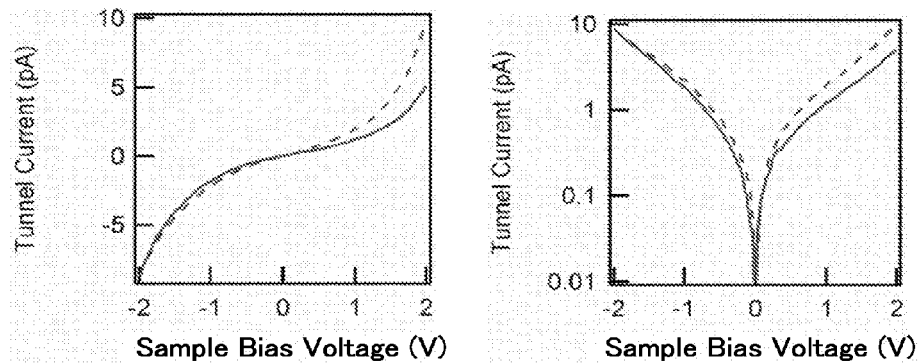
Figure 12C:
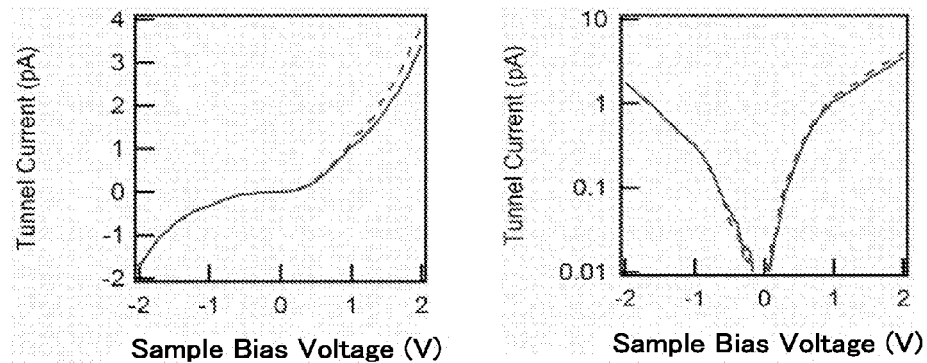
Figure 13A:
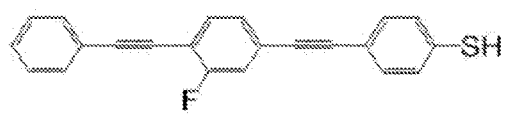
FIGS. 13A, 13B, and 13C are diagrams illustrating a structure and evaluation results of an organic molecule used in Example 6 and Comparative Example 6.
Figure 13B:
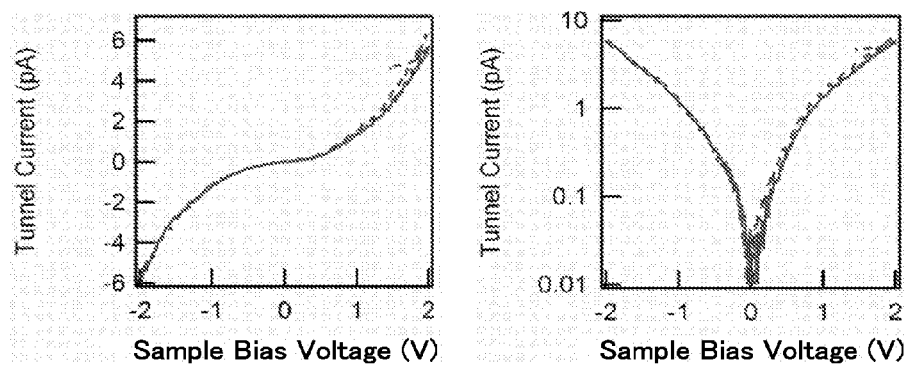
Figure 13C:
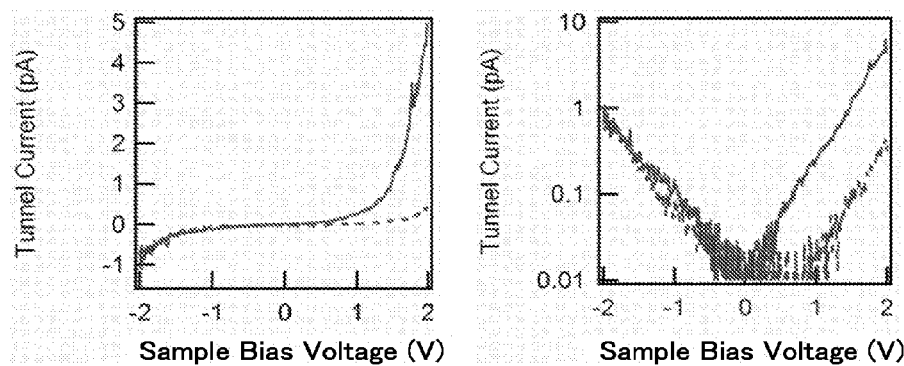
Figure 14A:
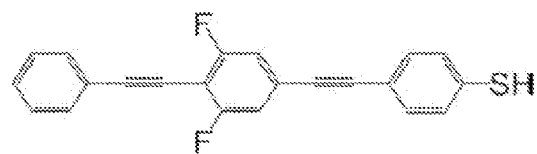
FIGS. 14A, 14B, and 14C are diagrams illustrating a structure and evaluation results of an organic molecule used in Example 7 and Comparative Example 7.
Figure 14B:
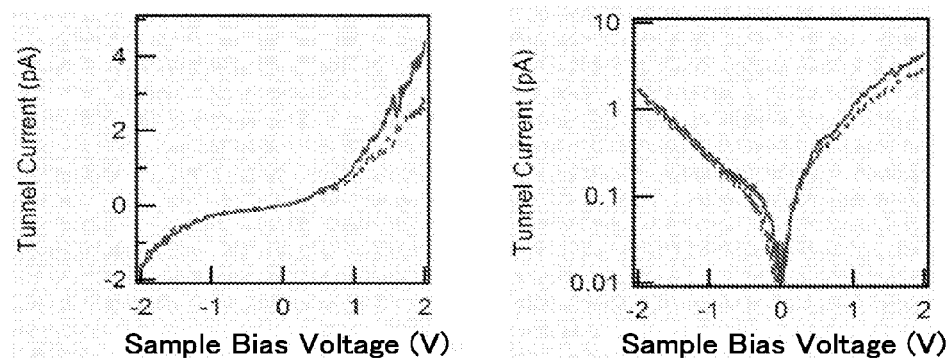
Figure 14C:
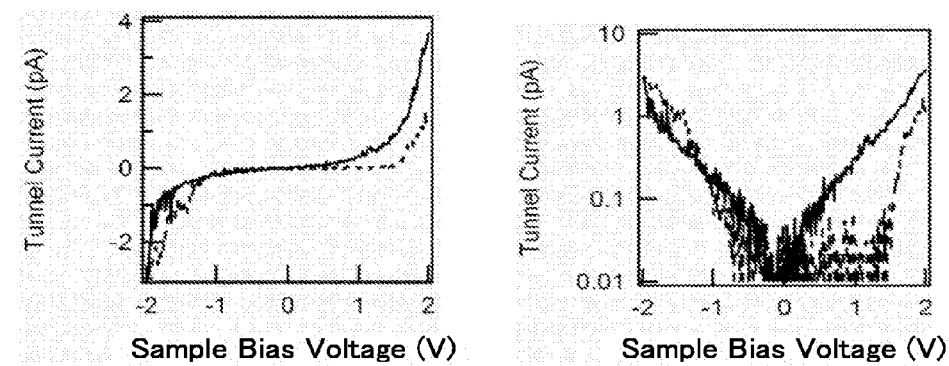
Figure 15A:
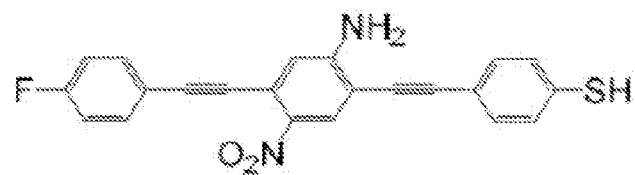
FIGS. 15A, 15B, and 15C are diagrams illustrating a structure and evaluation results of an organic molecule used in Example 8 and Comparative Example 8.
Figure 15B:
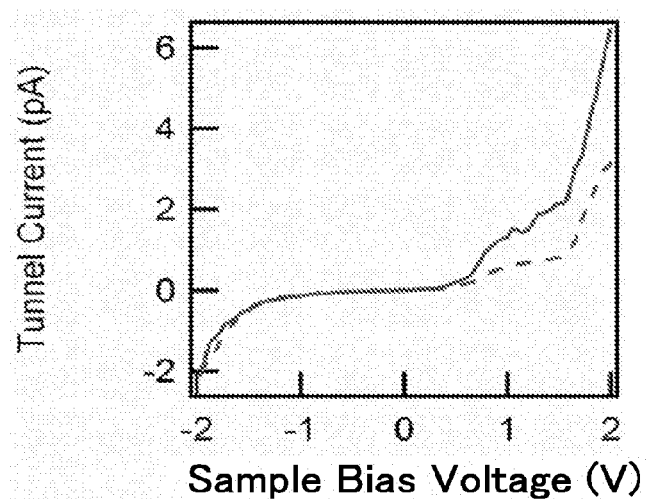
Figure 15C:
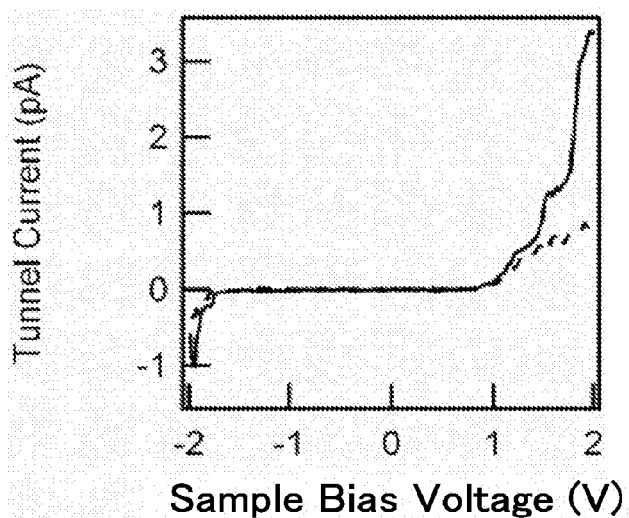
Figure 16A:
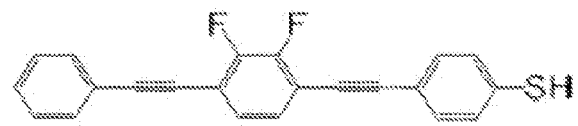
FIGS. 16A, 16B, and 16C are diagrams illustrating a structure and evaluation results of an organic molecule used in Example 9 and Comparative Example 9.
Figure 16B:
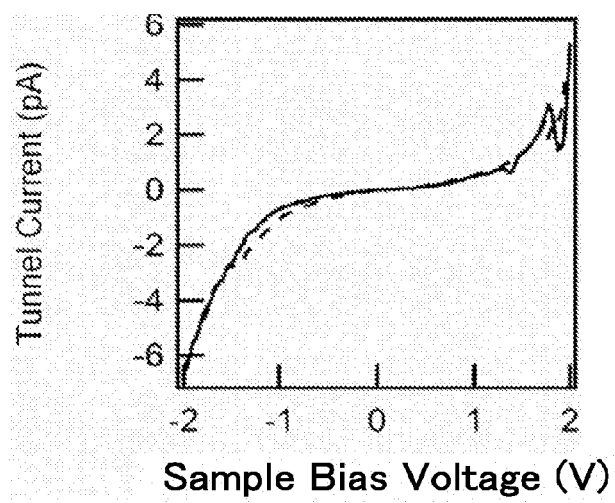
Figure 16C:
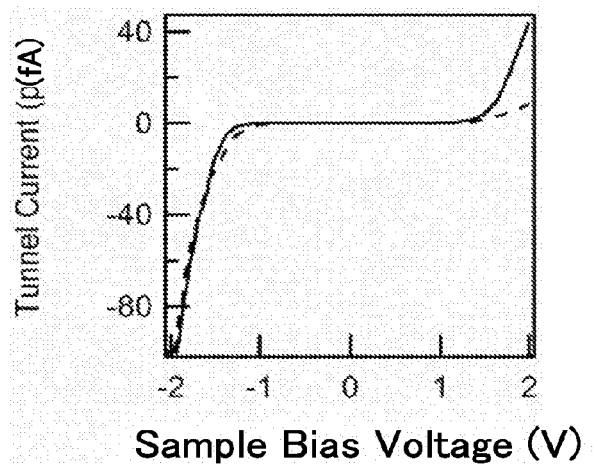

A first organic molecule was fixed onto a gold (Au) substrate with a (111) surface by bonding gold and a sulfur atom using the organic molecule shown in FIG. 8A. An octaalkyl chain as a second organic molecule was fixed to a tungsten (W) probe (tip) of a scanning tunneling microscope (STM) by bonding tungsten and a sulfur atom using octaalkylthiol. Thereafter, current flowing across the gold substrate and the tungsten probe was measured by the STM.

Examples 2 to 9

Other than using the organic molecules shown in FIGS. 9A to 16A, sample preparations and measurements similar to those in Example 1 were performed.

Comparative Example 1

Other than not fixing an octaalkyl chain to a tungsten probe, sample preparations and measurements similar to those in Example 1 were performed.

Comparative Examples 2 to 9

Other than using the organic molecules shown in FIGS. 9A to 16A, sample preparations and measurements similar to those in Comparative Example 1 were performed.

In any of Examples 1 to 9, it was confirmed that the current-voltage characteristics have hysteresis to function as a resistance-change type memory. Further, in any of Examples 1 to 9, a noise reduction and a leak current reduction were confirmed, compared to Comparative Examples 1 to 9 as the respective comparative examples.

In the graphs of current-voltage characteristics in FIGS. 8B to FIG. 16B and FIG. 8C to FIG. 16C, a solid line and a dotted line are IV curves resulting from current measurements with voltage changed in scanning direction. Although in the embodiment, a cross-point type organic molecular memory has been described as an example as an organic molecular memory, the present disclosure can be applied to organic molecular memories of other structures.

While certain embodiments have been described, these embodiments have been presented by way of example only, and are not intended to limit the scope of the inventions. Indeed, the organic molecular memory described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An organic molecular memory comprising:
a first electrode having a first work function;
a second electrode having a second work function; and
an organic molecular layer provided between the first electrode and the second electrode, the organic molecular layer containing a first organic molecule chemically bonded to the first electrode, the first organic molecule having a resistance-change type molecular chain, and the first organic molecule having a first energy level higher than the first work function, and a second organic molecule chemically bonded to the second electrode and the second organic molecule having a second energy level higher than the second work function and lower than the first energy level.

2. The organic molecular memory according to claim 1, wherein a first blocking coefficient $p_1$ expressed by expression (1) wherein $\phi_1$ is the first work function, $e_1$ is the first energy level, and $L_1$ is a length of the first organic molecule, is higher than a second blocking coefficient $p_2$ expressed by expression (2) wherein $\phi_2$ is the second work function, $e_2$ is the second energy level, and $L_2$ is a length of the second organic molecule:

$$p_1 = (\phi_1 - e_1)^{1/2} \times L_1 \quad (1)$$

$$p_2 = (\phi_2 - e_2)^{1/2} \times L_2 \quad (2).$$

3. The organic molecular memory according to claim 1, wherein the second organic molecule contains an alkyl chain with a carbon number of three or more to eleven or less.

4. The organic molecular memory according to claim 1, wherein the first organic molecule contains a one-dimensional or pseudo-one-dimensional π-conjugated system chain, the π-conjugated system chain having an electron withdrawing group or an electron donating group bonded in a direction other than a straight chain axis direction.

5. The organic molecular memory according to claim 4, wherein the π-conjugated system chain contains either of a carbon compound selected from a group consisting of an acetylene skeleton, a diethylene skeleton, and a phenylene ring, or a heterocyclic compound selected from a thiophene ring, a pyrrole ring, and a furan ring.

6. The organic molecular memory according to claim 1, wherein the first organic molecule is described by molecular formula (1):

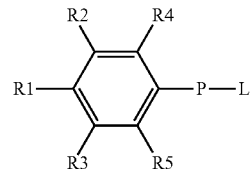

(1)

wherein P is a one-dimensional or pseudo-one-dimensional π-conjugated system chain, the π-conjugated system chain having an electron withdrawing group or an electron donating group bonded in a direction other than a straight chain axis direction, R1 is an amino group (—NH$_2$) or a nitro group (—NO$_2$), R2 to R4 are one of hydrogen atom or methyl group (—CH$_3$), and L is a chemically modifying group chemically bonding the first organic molecule to the first electrode.

7. The organic molecular memory according to claim 6, wherein the L is a chemically modifying group selected from a group consisting of a thioether group (—S—), a dialkylsilylether group (—SiR$_2$O—), an ether group (—O—), a phosphonate ester group (—PO$_3$—), an ester group (—COO—), and an azo group (—N$_2$—).

8. The organic molecular memory according to claim 1, wherein the first organic molecule is described by molecular formula (2):

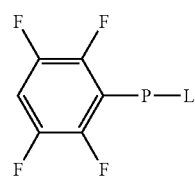

(2)

wherein P is a one-dimensional or pseudo-one-dimensional π-conjugated system chain, the π-conjugated system chain having an electron withdrawing group or an electron donating group bonded in a direction other than a straight chain axis direction, and L is a chemically modifying group chemically bonding the first organic molecule to the first electrode.

9. The organic molecular memory according to claim 8, wherein the L is a chemically modifying group selected from a group consisting of a thioether group (—S—), a dialkylsilylether group (—SiR$_2$O—), an ether group (—O—), a phosphonate ester group (—PO$_3$—), an ester group (—COO—), and an azo group (—N$_2$—).

10. The organic molecular memory according to claim 1, wherein the first organic molecule is described by molecular formula (3):

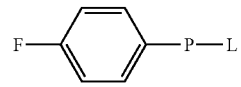

(3)

wherein P is a one-dimensional or pseudo-one-dimensional π-conjugated system chain, the π-conjugated system chain having an electron withdrawing group or an electron donating group bonded in a direction other than a straight chain axis direction, and L is a chemically modifying group chemically bonding the first organic molecule to the first electrode.

11. The organic molecular memory according to claim 10, wherein the L is a chemically modifying group selected from a group consisting of a thioether group (—S—), a dialkylsilylether group (—SiR$_2$O—), an ether group (—O—), a phosphonate ester group (—PO$_3$—), an ester group (—COO—), and an azo group (—N$_2$—).

12. The organic molecular memory according to claim 1, wherein the first electrode or the second electrode contains a metal selected from a group consisting of gold (Au), silver (Ag), copper (Cu), platinum (Pt), palladium (Pd), iron (Fe), tungsten (W), tungsten nitride (WN$_2$), tantalum (Ta), tantalum nitride (TaN), molybdenum (Mo), molybdenum nitride (MoN), and titanium nitride (TiN).

13. The organic molecular memory according to claim 1, wherein the first organic molecule and the second organic molecule are not chemically bonded.

14. The organic molecular memory according to claim 1, wherein the first electrode and the second electrode contain different metals.

* * * * *